(12) United States Patent
Okumura et al.

(10) Patent No.: US 9,269,869 B2
(45) Date of Patent: Feb. 23, 2016

(54) SEMICONDUCTOR OPTICAL ELEMENT

(75) Inventors: Tadashi Okumura, Tokyo (JP); Shinichi Saito, Tokyo (JP); Kazuki Tani, Tokyo (JP); Etsuko Nomoto, Tokyo (JP); Katsuya Oda, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 7 days.

(21) Appl. No.: 14/364,074

(22) PCT Filed: Dec. 12, 2011

(86) PCT No.: PCT/JP2011/078677
§ 371 (c)(1),
(2), (4) Date: Jul. 11, 2014

(87) PCT Pub. No.: WO2013/088490
PCT Pub. Date: Jun. 20, 2013

(65) Prior Publication Data
US 2014/0355636 A1  Dec. 4, 2014

(51) Int. Cl.
*H01L 27/12* (2006.01)
*H01L 21/36* (2006.01)
*H01L 33/34* (2010.01)
*H01S 5/32* (2006.01)
*H01L 33/44* (2010.01)
*H01L 31/103* (2006.01)
*H01S 5/02* (2006.01)
*H01S 5/22* (2006.01)
*H01L 31/0352* (2006.01)

(52) U.S. Cl.
CPC ............. *H01L 33/34* (2013.01); *H01L 33/44* (2013.01); *H01S 5/3211* (2013.01); *H01S 5/3219* (2013.01); *H01S 5/3223* (2013.01); *H01L 31/035272* (2013.01); *H01L 31/103* (2013.01); *H01S 5/021* (2013.01); *H01S 5/2214* (2013.01)

(58) Field of Classification Search
CPC ........................................................ H01L 33/34
USPC ............... 257/347, 103, 86; 438/481, 341, 31
See application file for complete search history.

(56) References Cited

U.S. PATENT DOCUMENTS 7,596,158 B2 * 9/2009 Liu .................... B82Y 20/00
372/43.01
8,294,213 B2 * 10/2012 Miura ............... H01L 21/02381
257/184

(Continued)

FOREIGN PATENT DOCUMENTS

JP      11-177122 A    7/1999
JP    2003-163361 A    6/2003

(Continued)

*Primary Examiner* — Calvin Lee
(74) *Attorney, Agent, or Firm* — Miles & Stockbridge P.C.; Eric G. King

(57) ABSTRACT

In order to provide a highly reliable silicon-germanium semiconductor optical element of high luminous efficiency or of low power consumption that can reduce or prevent the occurrence of dislocations or crystal defects on the interface between a light emitting layer or a light absorption layer and a cladding layer, in a silicon-germanium semiconductor optical element, a germanium protective layer 11 of non-light emission is disposed between a germanium light emitting layer or the light absorption layer 10 and a cladding layer 12 disposed above a substrate. The germanium protective layer 11 has the electrical conductivity different from electrical conductivity of the germanium light emitting layer or the light absorption layer 10.

16 Claims, 18 Drawing Sheets

(56) References Cited

U.S. PATENT DOCUMENTS

| | | | |
|---|---|---|---|
| 8,797,484 B2 * | 8/2014 | Iwase | B32B 37/003 349/122 |
| 2007/0105251 A1 | 5/2007 | Liu et al. | |
| 2011/0031529 A1 | 2/2011 | Miura et al. | |
| 2012/0287959 A1 * | 11/2012 | Tani | H01L 33/34 372/45.01 |

FOREIGN PATENT DOCUMENTS

| | | |
|---|---|---|
| JP | 2003-282932 A | 10/2003 |
| JP | 2009-514231 A | 4/2009 |
| JP | 2011-181874 A | 9/2011 |
| WO | WO 2007/053431 A2 | 5/2007 |

* cited by examiner

SEMICONDUCTOR OPTICAL ELEMENT

TECHNICAL FIELD

The present invention relates to a semiconductor optical element that emits and receives light using silicon and germanium.

BACKGROUND ART

Studies of optical devices and optical circuits, which are formed on a silicon substrate, more specifically on an SOI (Silicon on Insulator) substrate, are conducted actively, and a field called silicon photonics is created. Since the light emission and absorption coefficients of silicon are smaller than the light emission and absorption coefficients of III-V compound semiconductors, which are practically used, the introduction of germanium of excellent integration with silicon is zealously attempted (Patent literatures 1 and 2, for example).

CITATION LIST

Patent Literature

Patent Literature 1: Published Japanese Translation of PCT Patent Application No. 2009-514231
Patent Literature 2: Japanese Patent Application Laid-Open Publication No. Hei 11-177122

SUMMARY OF INVENTION

Problems that the Invention is to Solve

The study of silicon-germanium semiconductor optical elements is conducted aiming for implementing an optical element monolithically integrated on a silicon substrate. Patent Literature 1 discloses a method for improving luminous efficiency in which a germanium light emitting layer is doped with an impurity and tensile-strained to cause direct transition. Moreover, similarly to practically used III-V semiconductor lasers, in Patent Literature 1, a silicon or silicon-germanium mixed-crystal layer, for example, whose band gap is greater than the band gap of the germanium light emitting layer, is disposed above and below the germanium light emitting layer, and the effect of carrier confinement is obtained.

However, the luminous efficiency of germanium affects impurity doping and tensile strain described in Patent Literature 1 as well as the surface state and defects of the germanium light emitting layer. The lattice constants of silicon and germanium are 5.431 angstroms and 5.658 angstroms, respectively, including about 4% of lattice mismatching. Generally, large numbers of dislocations and defects occur on the interfaces of a silicon layer, a silicon-germanium mixed-crystal layer, and a germanium layer. As illustrated in FIG. 6A, when dislocations and defects exist on the interface between a germanium light emitting layer 10 and a silicon-germanium mixed-crystal layer (a cladding layer) 12, carriers are decayed as non-luminescent components, and the luminous efficiency is reduced.

Moreover, as the influence on element characteristics caused by the defects, in the case where defects exist on the interface between a p-type semiconductor and an n-type semiconductor, the leakage current of a pn diode is increased, and the improvement of the characteristics is hampered from the point of low power consumption and reliability. More specifically, since the semiconductor laser includes a pn junction near the light emitting layer, it is optically and electrically important to reduce defects on the light emitting layer interface.

In order to design a waveguide element including a semiconductor laser, it is necessary to consider the behavior of the carrier as well as the structure of an optical waveguide. More specifically, it is demanded for a modulator and a laser to guide light at low losses. To this end, a material whose refractive index and loss are lower than the refractive index and loss of the light emitting layer is disposed as a cladding layer above and below the light emitting layer. In a waveguide using a germanium layer for a core layer, a silicon layer or a silicon-germanium mixed-crystal layer functions as a cladding layer material. FIG. 6A is an exemplary structure investigated by the inventors. As illustrated in FIG. 6A, such a structure is formed in which a p-type silicon-germanium mixed-crystal layer (a cladding layer) 12 and a silicon cap layer 6 are disposed above a light emitting layer. Here, a reference numeral 1 denotes a buried oxide film, a reference numeral 2 denotes an SOI layer, a reference numeral 5 denotes a silicon-germanium mixed-crystal layer, a reference numeral 10 denotes an n-type germanium light emitting layer or a light absorption layer (in the following, referred to as a light emitting layer or the like), and a cross expresses a dislocation or a crystal defect. It is noted that the same reference numeral expresses the same component. The silicon-germanium mixed-crystal layers 5 and 12 are formed so as to reduce or prevent a dislocation or a defect. However, under the present circumstances, crystal defects occur on the interface between the light emitting layer or the like 10 and the p-type silicon-germanium mixed-crystal layer (the cladding layer) 12 caused by lattice mismatching as illustrated in FIG. 6A. The defects on the interface increase a leakage current, and hamper the improvement of the characteristics from the point of the luminous efficiency of a light emitting element and from the point of the low power consumption and reliability of a light receiving element.

From the investigation above, in order to implement a silicon-germanium semiconductor optical element of a high performance including a germanium laser, it is necessary to form a waveguide structure, and at the same time, to reduce a non-light emission component by suppressing the influence of defects.

It is an object of the present invention to provide a highly reliable silicon-germanium semiconductor optical element of high luminous efficiency or of low power consumption that can reduce or prevent the occurrence of dislocations or crystal defects on the interface between a light emitting layer or a light absorption layer and a cladding layer.

Means for Solving the Problems

An embodiment to achieve the object is a semiconductor optical element including: a semiconductor substrate; a germanium light emitting layer or a germanium light absorption layer formed on the substrate; and an insulating film formed on the substrate. The semiconductor optical element includes a structure in which: a germanium protective layer whose electrical conductivity is different from electrical conductivity of the light emitting layer or the light absorption layer is disposed above the light emitting layer or the light absorption layer; a cladding layer whose electrical conductivity is the same as electrical conductivity of the protective layer is formed above the germanium protective layer; and an insulating layer is disposed on both side surfaces of the light emitting layer or the light absorption layer.

Moreover, a semiconductor optical element includes: a substrate including silicon; an n-type germanium buffer layer formed above the substrate; an n-type germanium light emitting layer or an n-type germanium light absorption layer formed on the n-type germanium buffer layer; a p-type germanium protective layer of non-light emission formed on the light emitting layer or the light absorption layer; and a cladding layer including a p-type silicon-germanium mixed-crystal layer and formed on the p-type germanium protective layer.

Advantageous Effects of Invention

According to the present invention, the protective layer is disposed between the light emitting layer or the light absorption layer and the cladding layer, so that it is possible to provide a highly reliable silicon-germanium semiconductor optical element of high luminous efficiency or of low power consumption that can reduce or prevent the occurrence of dislocations or crystal defects on the interface between a light emitting layer or a light absorption layer and a cladding layer.

DESCRIPTION OF EMBODIMENTS

Figure 6A:
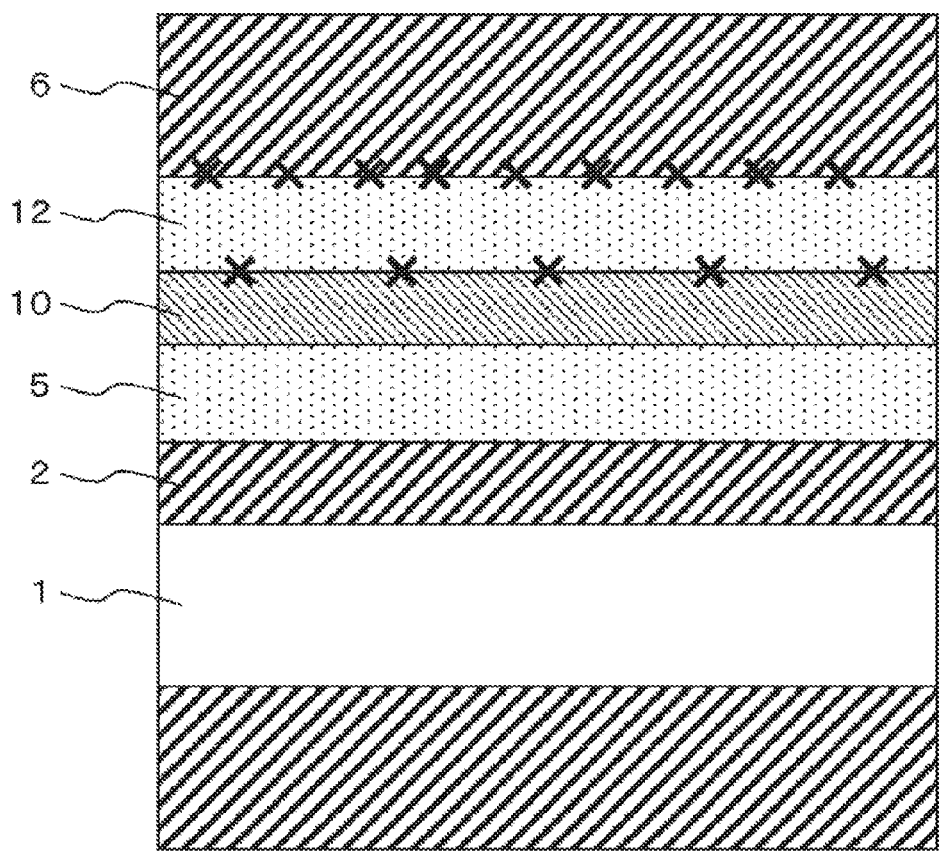
FIG. 6A is a schematic cross sectional view of an exemplary silicon-germanium semiconductor optical element used for investigation conducted by the inventors.
Figure 6B:
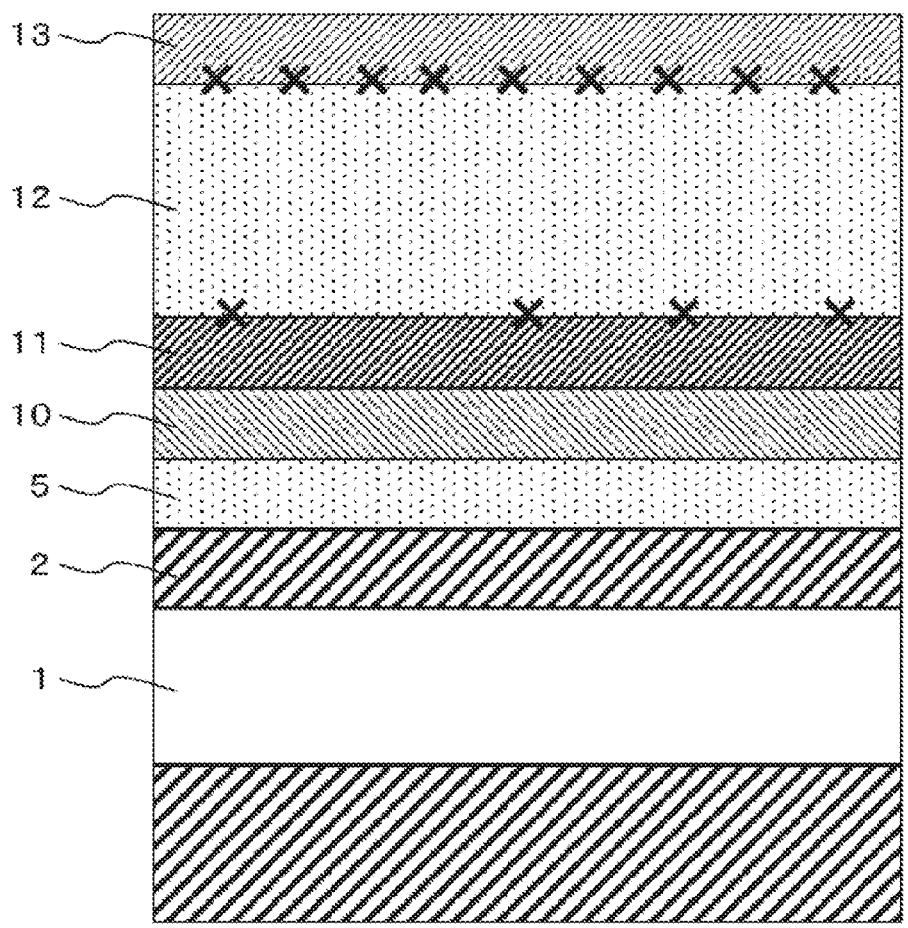
FIG. 6B is a schematic cross sectional view of an exemplary silicon-germanium semiconductor optical element according to an embodiment.

The inventors have thought that it is extremely difficult to prevent crystal defects from occurring in an element, and investigated the improvement of luminous efficiency of a light emitting element or a reduction in power consumption of a light receiving element as the premise is that crystal defects exist in the elements. The inventors have come to realize that such a protective layer is provided between a light emitting layer or the like and a cladding layer that dislocations and crystal defects do not occur on the interface with the light emitting layer or the light absorption layer (the light emitting layer or the like) but dislocations and crystal defects occur on the interface with the cladding layer. For the protective layer, such a material is used that the lattice constant is the same as the lattice constant of the light emitting layer or the like and the electrical conductivity is different so as not to produce defects on the interface with the light emitting layer or the like. A non-light emission material is desirable. FIG. 6B is an exemplary cross sectional structural diagram of a silicon-germanium semiconductor optical element. The silicon-germanium semiconductor optical element is a waveguide element in a structure of germanium, silicon-germanium mixed crystal, and polysilicon. As illustrated in FIG. 6B, a germanium protective layer 11 is provided on a germanium light emitting layer or the like 10, and no defects are not produced on the interface with the light emitting layer or the like 10 caused by lattice mismatching. It is optimum to use the same material for the layers. However, for the layers above and below the germanium light emitting layer or the like, a silicon-germanium mixed-crystal layer may be provided whose lattice mismatching to germanium is small enough not to cause defects. Defects caused by lattice mismatch mismatching are produced above the germanium protective layer 11. The protective layer 11 on the light emitting layer or the like has the electrical conductivity different from the electrical conductivity of the light emitting layer or the like, and a polysilicon layer 13 is doped with an impurity at high concentration.

Moreover, such a structure can be formed that an insulating layer is disposed on both sides of the germanium light emitting layer or the like.

In the following, examples will be described in detail with reference to the drawings.

Example 1

In this example, a germanium laser diode, which is one of silicon-germanium semiconductor optical elements, and a method for manufacturing the same will be mainly described. FIGS. 1A to 1F are cross sectional structures in order of manufacturing process steps.

In the following, the manufacturing process steps will be described in order.

In order to prevent light leakage to the Si substrate side, an SOI substrate is prepared in which a buried oxide film 1 in a thickness of 1 μm or more is provided on a Si substrate. An SOI layer 2 is an n-type including a (100) plane, and has a thickness of about 200 to 300 nm capable of forming a single mode silicon wire waveguide. It is noted that in the example, an example using an SOI substrate is shown. However, a GeOI (Germanium on Insulator) substrate may also be used.

Figure 1A:
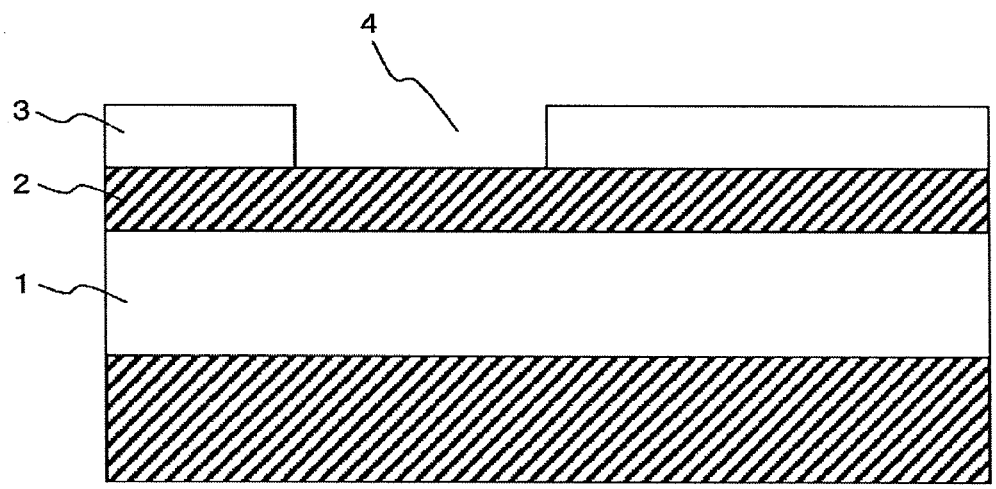
FIG. 1A is a schematic cross sectional view of an element in the manufacturing process steps of a silicon-germanium light emitting element according to Example 1.

After cleaning the SOI substrate, an insulating film 3 in a film thickness of 200 nm is formed by thermal oxidation. Alternatively, a silicon dioxide insulating film may be deposited on the surface using a Chemical Vapor Deposition (in the following, abbreviated to CVD) device, for example. Subsequently, a resist is applied, and a region on which germanium is formed is patterned by photolithography. Subsequently, the resist pattern is transferred to the thermal oxidation film to form an opening 4 by anisotropic dry etching or chemical etching using hydrofluoric acid, the surface of the SOI layer is partially exposed, and the resist is removed (FIG. 1A).

Figure 1B:
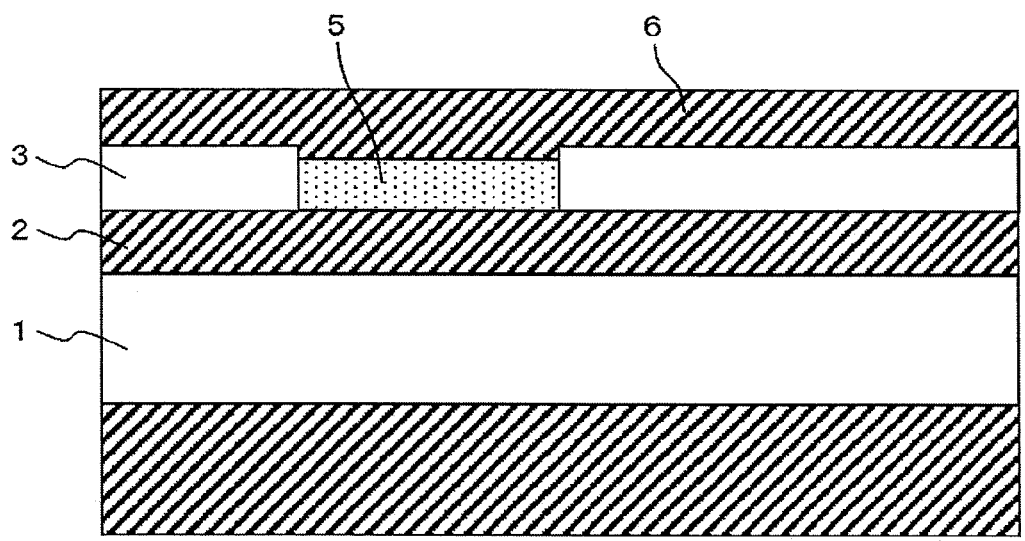
FIG. 1B is a schematic cross sectional view of the element in the manufacturing process steps of the silicon-germanium light emitting element according to Example 1.

Subsequently, the substrate is cleaned, a silicon-germanium mixed-crystal layer 5 (the germanium composition is 30%) in a film thickness of 30 nm is epitaxially grown on the cleaned SOI layer, and the surface is protected using a silicon cap layer 6 (FIG. 1B).

Figure 1C:
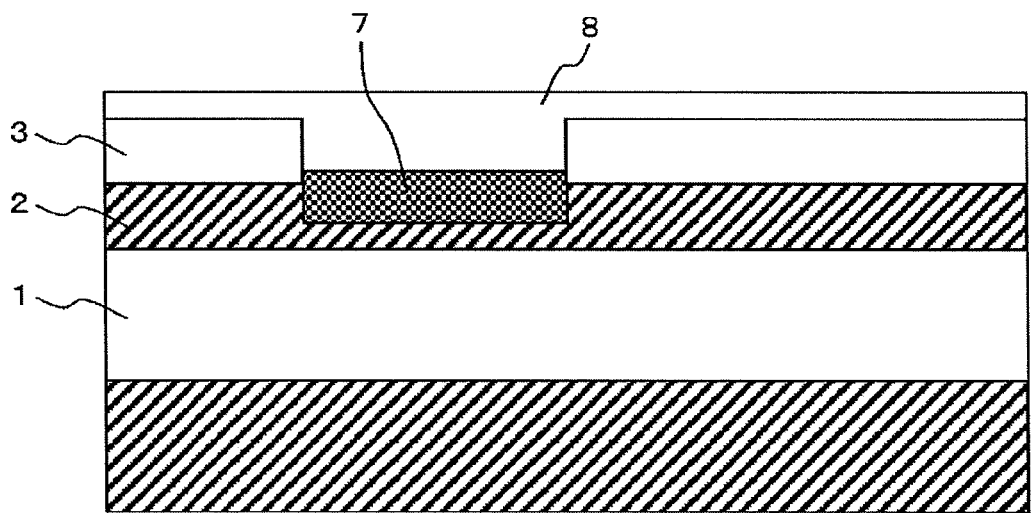
FIG. 1C is a schematic cross sectional view of the element in the manufacturing process steps of the silicon-germanium light emitting element according to Example 1.

After that, silicon in the surface silicon cap layer 6 and the silicon-germanium mixed-crystal layer 5 is oxidized by thermal oxidation processing, and a germanium buffer layer 7 condensed on the SOI layer 2 is selectively formed (FIG. 1C). The germanium layer is formed in the state of particularly good crystallizability using this condensation oxidation method. It is noted that since the SOI layer 2 is an n-type, the germanium buffer layer 7 is also an n-type.

Figure 1D:
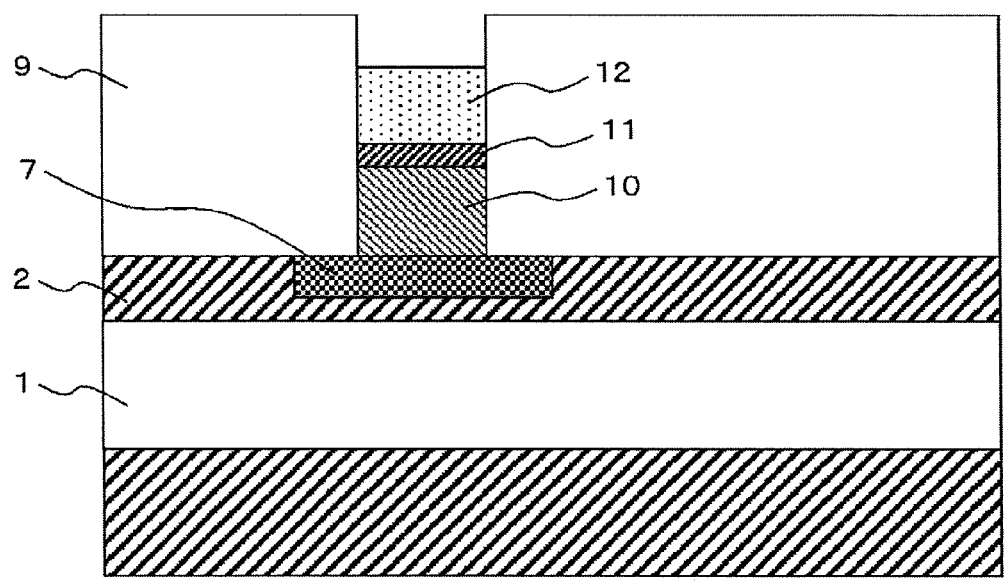
FIG. 1D is a schematic cross sectional view of the element in the manufacturing process steps of the silicon-germanium light emitting element according to Example 1.

Subsequently, the insulating film 3 and a silicon dioxide film 8 are removed, a silicon dioxide insulating film 9 is deposited in a thickness of 500 nm by CVD, for example, and the surface of the germanium layer formed by the condensation oxidation method (in the following, referred to as a condensation oxidation germanium layer) is exposed by photolithography and chemical etching. Subsequently, an n-type doped light emitting layer 10 (in a thickness of 200 nm) is epitaxially grown. An excellent light emitting layer 10 with few dislocations is obtained because the light emitting layer 10 is formed on the condensation oxidation germanium layer of high quality, and the insulating film is disposed on both side walls of the light emitting layer 10. The light emitting layer 10 was doped to an n-type at an impurity concentration of $2 \times 10^{19}/cm^3$. As described in Patent Literature 1, since an energy gap is small at Point L at the bottom of the conduction band of germanium and Point Γ, which is direct transition energy, carriers are injected to Point Γ when carriers are injected highly densely even though full direct transition is made, and electrons and holes can be recombined in direct transition. It is noted that it is preferable to use Ge for the base layer of the germanium light emitting layer 10. However, a $Si_{1-x}Ge_x$ layer ($0 \leq x \leq 1$) whose electrical conductivity is the same as the electrical conductivity of the germanium light emitting layer 10 may be used. In this case, it is desirable that Ge is rich near the germanium light emitting layer 10. Subsequently, in order to form an excellent pn junction without causing defects on the upper part of the light emitting layer 10, a p-type germanium layer (a protective layer) 11 of non-light emission is formed to protect the surface of the n-type germanium light emitting layer 10. The p-type germanium layer 11 has a low defect density because the p-type germanium layer 11 is made of the same material as the material of the n-type germanium light emitting layer 10 and in lattice matching with the n-type germanium light emitting layer 10, so that such an element can be prepared that carrier trapping on the interface with the n-type germanium light emitting layer 10 is suppressed and light can be emitted highly efficiently. It is noted that although it is preferable to form the protective layer using Ge, such a structure may be included in which the germanium composition of $Si_{1-x}Ge_x$ ($0 \leq x \leq 1$) in the layer is changed step by step or continuously and Ge is rich on the germanium light emitting layer side. Moreover, a p-type silicon-germanium mixed-crystal layer 12 (the germanium composition is 80%) is formed as a cladding layer on the p-type germanium layer 11 in which the wavelength is about 1.6 μm and the refractive index is lower than the refractive index of the light emitting layer 10 (FIG. 1D). It is noted that $Si_{1-x}Ge_x$ ($0 \leq x \leq 1$) can be used for the cladding layer, and such a structure may be formed in which the germanium composition $Si_{1-x}Ge_x$ ($0 \leq x \leq 1$) is changed step by step or continuously in the layer.

Figure 1E:
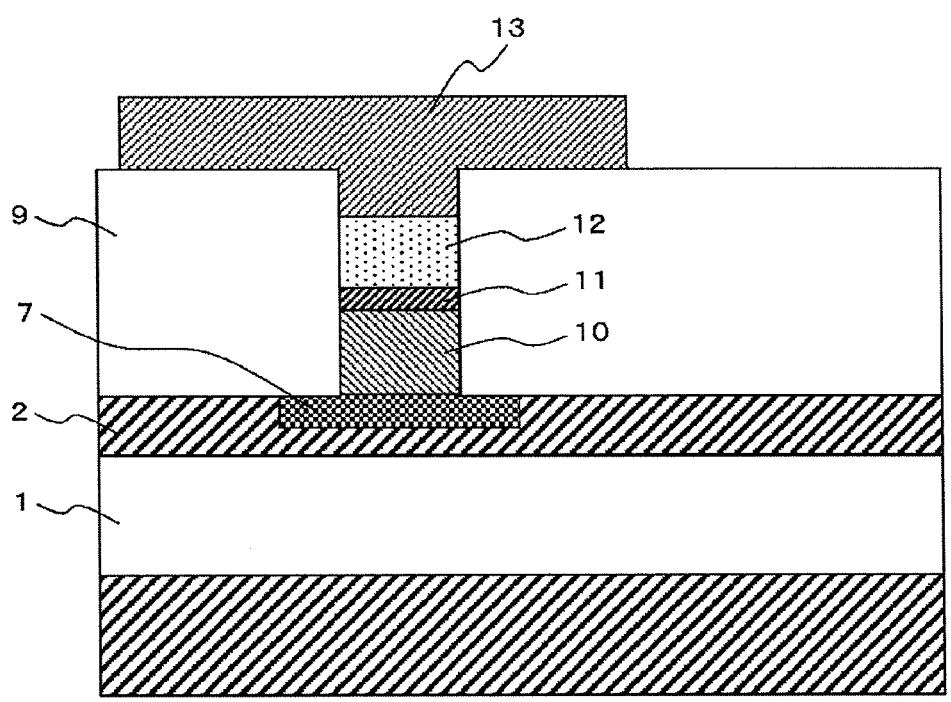
FIG. 1E is a schematic cross sectional view of the element in the manufacturing process steps of the silicon-germanium light emitting element according to Example 1.

Subsequently, a p-type polysilicon layer 13 doped with an impurity at a high concentration of about $1 \times 10^{20}/cm^3$ is deposited, and the semiconductor layer structure according to the example is formed (FIG. 1E).

As described above, the germanium light emitting layer 10 has a low defect density because the germanium light emitting layer 10 is sandwiched between the germanium layers having the same material, so that such a light emitting layer is formed in which carrier trapping is suppressed on the light emitting layer interface and light can be emitted highly efficiently. Although defects caused by lattice mismatching remain on the interface between the p-type silicon-germanium mixed-crystal layer (the cladding layer) 12 and the p-type polysilicon layer 13, carrier trapping caused by the defects is reduced in the germanium layers 10 and 11 or the silicon-germanium mixed-crystal layer (the cladding layer) 12 by gathering the defects on the interface with the polysilicon layer 13. Carriers are supplied sufficiently because the polysilicon layer 13 is doped at a high concentration, and it is possible to reduce the influence of carrier dissipation caused on the interface between the silicon-germanium mixed-crystal layer 12 and the polysilicon layer 13 due to carrier trapping. Moreover, the silicon-germanium semiconductor optical element according to the example can prepare a highly reliable germanium laser to which a high voltage at a high current density can be applied because a pn junction is provided on the interface of a low defect density. Furthermore, a leakage current is reduced on the pn junction interface, so that power consumption can be reduced and sensitivity can be increased in a silicon germanium optical absorption element.

Subsequently, a silicon dioxide insulating film 14 was deposited on the surface using a CVD device, for example. Subsequently, after applying a resist, a mask was exposed by photolithography to leave the resist only on a desired region, and then the silicon dioxide insulating film 14 was processed by wet etching to open the portions for a p-type electrode and an n-type electrode. In the processing, since the selection ratio of etching is sufficiently great between silicon dioxide and the electrodes, the openings can be formed with no problems even though a step is provided between the n-type electrode and the p-type electrode.

Figure 1F:
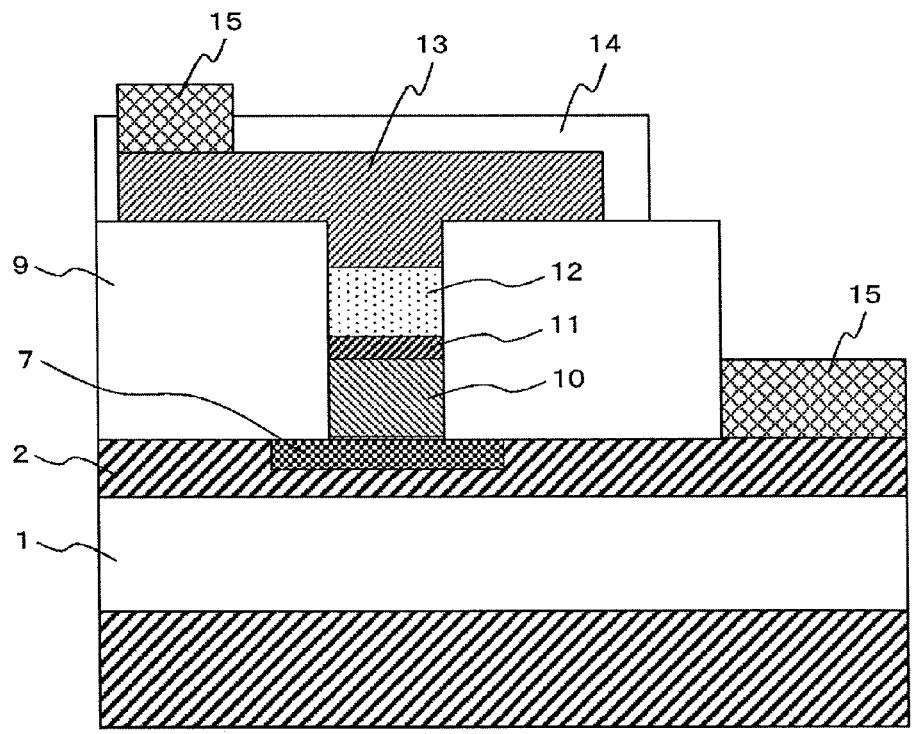
FIG. 1F is a schematic cross sectional view of the element in the manufacturing process steps of the silicon-germanium light emitting element according to Example 1.

Subsequently, after a TiN film and an Al film were in turn deposited entirely on the surface to form a stacked film, a resist was applied, a mask was exposed by photolithography to leave the resist only on desired regions (regions on which the p-type electrode and the n-type electrode were formed), the exposed Al film was then wet-etched, the TiN film was etched, and then an electrode 15 formed of the stacked film of the TiN film and the Al film was formed. It is noted that dry etching may be used instead of wet etching with no inconvenience. Subsequently, a hydrogen annealing process was applied, and a device was completed by performing a process of hydrogen termination on defects produced in processing (FIG. 1F).

As a result of evaluating the device, it was enabled to improve the luminous efficiency about a hundred times. Moreover, in the case where the structure was applied to a light receiving element, it was enabled to improve the power consumption about ten times.

According to the example, the germanium protective layer having the same material as the material of the light emitting layer is provided between the germanium light emitting layer and the silicon-germanium mixed-crystal layer (the cladding layer), so that it is possible to provide a highly reliable silicon-germanium semiconductor optical element of high luminous efficiency or of low power consumption that can reduce or prevent the occurrence of dislocations or crystal defects on the interface between a light emitting layer or a light absorption layer and a cladding layer.

Example 2

A second example will be described with reference to FIGS. 2A to 2G. It is noted that the matters described in Example 1 but not described in the example are also applicable to the example except in special circumstances.

In this example, a germanium laser diode, which is one of silicon-germanium semiconductor optical elements and has a high effect of confining electrons into germanium, and a method for manufacturing the same will be described. FIGS. 2A to 2G are cross sectional structures in order of manufacturing process steps.

In the following, the manufacturing process steps will be described in order.

In order to prevent light leakage to the Si substrate side, an SOI substrate is prepared in which a buried oxide film 1 in a thickness of 1 μm or more is provided on a Si substrate. Such an SOI layer 2 was prepared that the thickness was about 200 to 300 nm capable of forming a single mode silicon wire waveguide and the impurity concentration was low at background level.

Figure 2A:
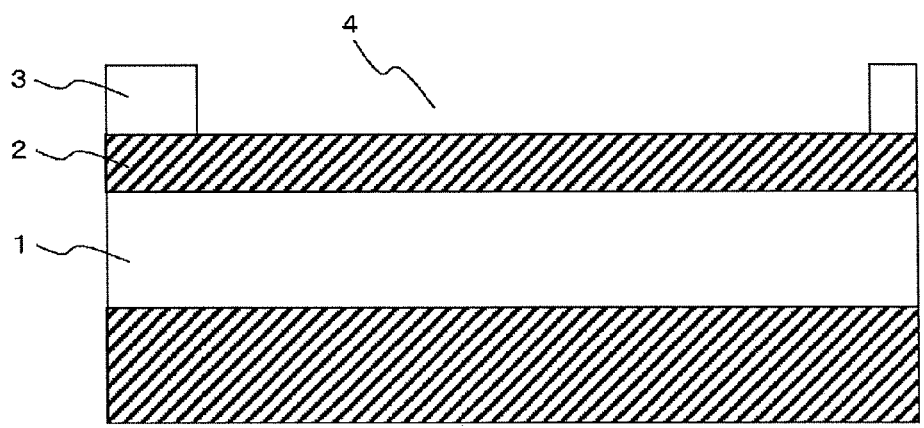
FIG. 2A is a schematic cross sectional view of an element in the manufacturing process steps of a silicon-germanium light emitting element according to Example 2.

After cleaning the SOI substrate, an insulating film 3 in a film thickness of 200 nm is formed by thermal oxidation. Alternatively, a silicon dioxide insulating film may be deposited on the surface using a CVD device, for example. Subsequently, a resist is applied, and a region on which germanium is formed (an insulating film opening) 4 is patterned by photolithography (FIG. 2A). The width of the region is sufficiently wide with respect to the width of the waveguide of the laser diode to the extent that an n-side metal electrode is also included.

Figure 2B:
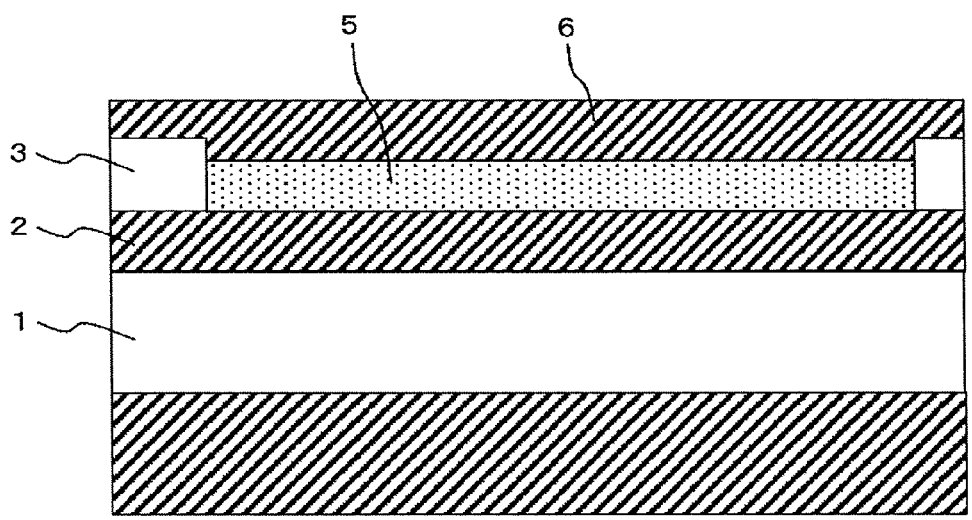
FIG. 2B is a schematic cross sectional view of the element in the manufacturing process steps of the silicon-germanium light emitting element according to Example 2.

A silicon-germanium mixed-crystal layer 5 (the germanium composition is 30%) in a film thickness of 10 nm is epitaxially grown on the cleaned SOI layer 2, and the surface is protected using a silicon cap layer 6 (FIG. 2B).

Figure 2C:
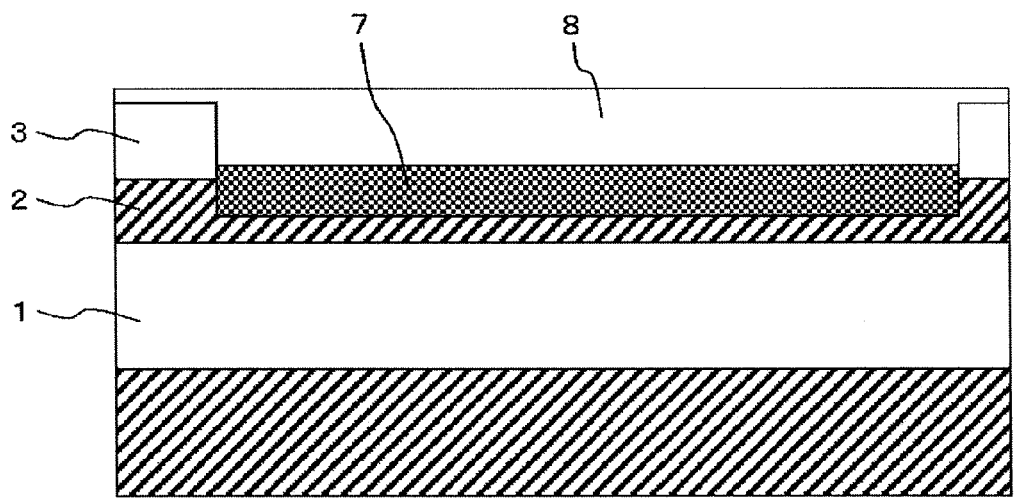
FIG. 2C is a schematic cross sectional view of the element in the manufacturing process steps of the silicon-germanium light emitting element according to Example 2.

After that, silicon in the surface silicon cap layer 6 and the silicon-germanium mixed-crystal layer 5 is oxidized by thermal oxidation processing, a germanium layer 7 condensed on the SOI layer 2 is formed (FIG. 2C). The condensation oxidation germanium layer is formed in the state of particularly good crystallizability. A reference numeral 8 denotes a silicon dioxide film.

Figure 2D:
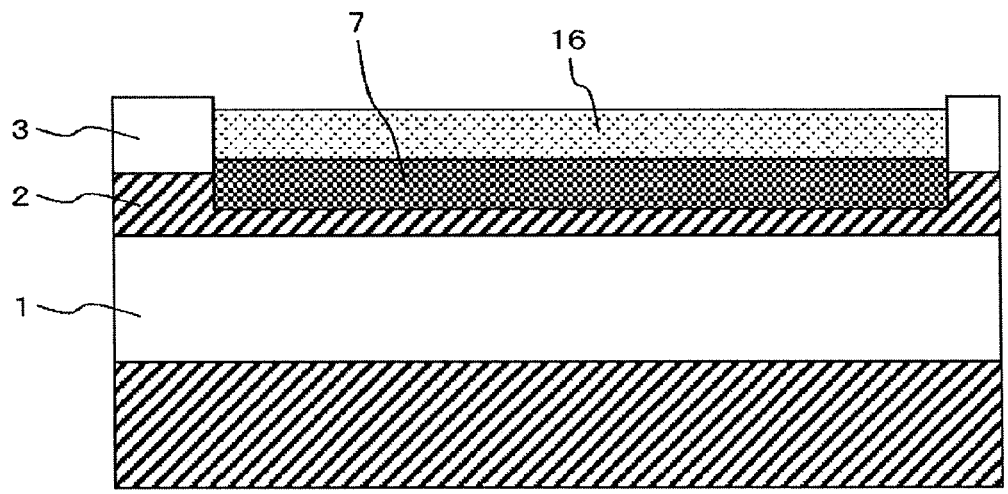
FIG. 2D is a schematic cross sectional view of the element in the manufacturing process steps of the silicon-germanium light emitting element according to Example 2.

Subsequently, the insulating film 3 and the silicon dioxide film 8 are removed, the insulating film 3 including an opening through which the condensation oxidation germanium layer 7 is exposed is formed, and then an n-type doped germanium buffer layer 16 (in a thickness of 200 nm) is formed on the surface of the condensation oxidation germanium layer 7 (FIG. 2D).

Figure 2E:
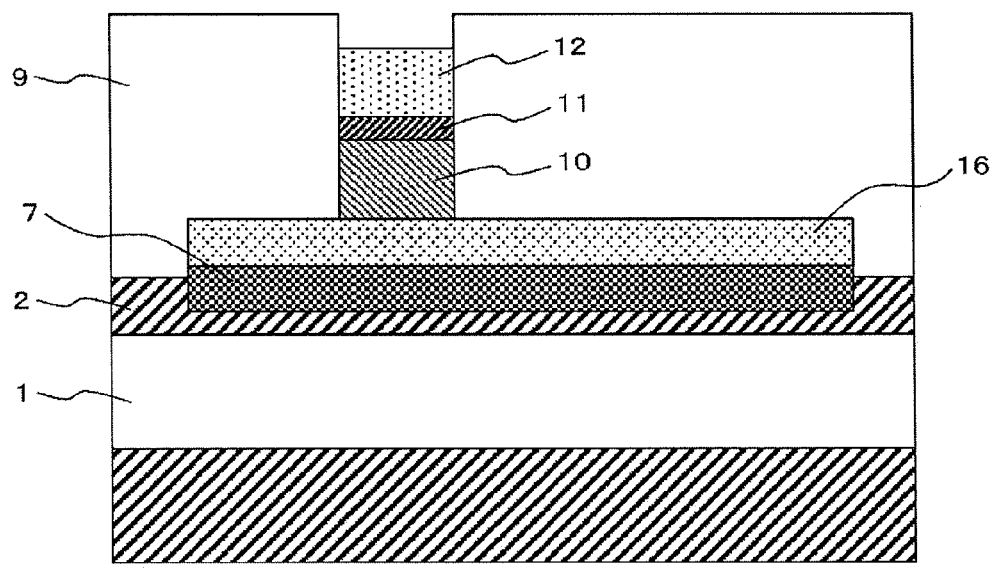
FIG. 2E is a schematic cross sectional view of the element in the manufacturing process steps of the silicon-germanium light emitting element according to Example 2.

Moreover, a silicon dioxide insulating film 9 is deposited in a thickness of 500 nm by CVD, for example, and the surface of the n-type germanium buffer layer 16 is exposed only on a region on which the germanium light emitting layer is formed by photolithography and chemical etching. An n-type germanium light emitting layer 10 (in a thickness of 200 nm) is epitaxially grown on the clean n-type germanium buffer layer 16. Subsequently, in order to form an excellent pn junction without causing defects on the upper part of the light emitting layer 10, a p-type germanium layer (a protective layer) 11 of non-light emission is formed to protect the surface of the n-type germanium light emitting layer 10. The p-type germanium layer 11 has a low defect density because the p-type germanium layer 11 is made of the same material as the material of the light emitting layer 10 and in lattice matching with the material of the light emitting layer 10, so that such an element can be prepared that carrier trapping on the light emitting layer interface is suppressed and light can be emitted highly efficiently. Moreover, a p-type silicon-germanium mixed-crystal layer 12 (the germanium composition is 80%) is formed as a cladding layer in which the wavelength is about 1.6 μm and the refractive index is lower than the refractive index of the light emitting layer (FIG. 2E).

Figure 2F:
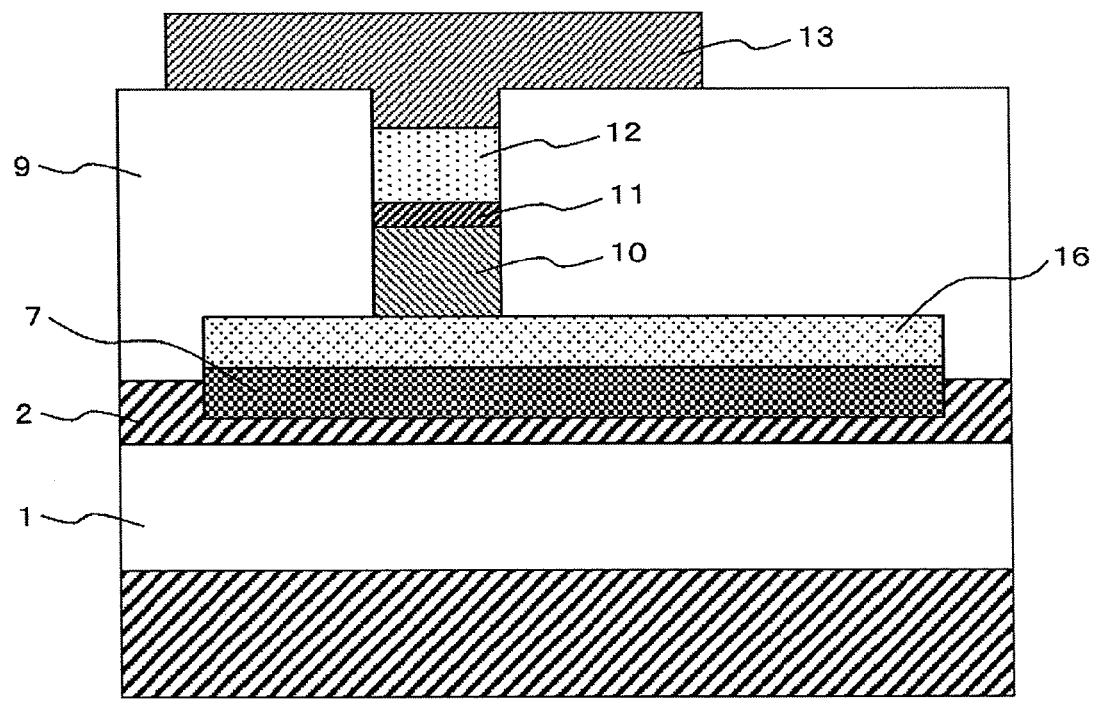
FIG. 2F is a schematic cross sectional view of the element in the manufacturing process steps of the silicon-germanium light emitting element according to Example 2.

Subsequently, a p-type polysilicon layer 13 doped with an impurity at a high concentration of about $1\times10^{20}/cm^3$ is deposited (FIG. 2F). As described above, the n-type germanium light emitting layer 10 has a low defect density because the n-type germanium light emitting layer 10 is sandwiched between the germanium layers 16 and 11 having the same material from above and below, so that such a light emitting layer is formed in which carrier trapping is suppressed on the light emitting layer interface and light can be emitted highly efficiently. Although defects caused by lattice mismatching remain on the interface between the p-type silicon-germanium mixed-crystal layer (the cladding layer) 12 and the p-type polysilicon layer 13, carrier trapping caused by the defects is reduced in the germanium layers 16, 10, 11 or the silicon-germanium mixed-crystal layer 12 by gathering the defects on the interface with the polysilicon layer 13. Since the polysilicon layer 13 is doped at a high concentration, carriers are supplied sufficiently, and it is possible to reduce the influence of carrier trapping caused on the interface between the silicon-germanium mixed-crystal layer 12 and the polysilicon layer 13.

Figure 2G:
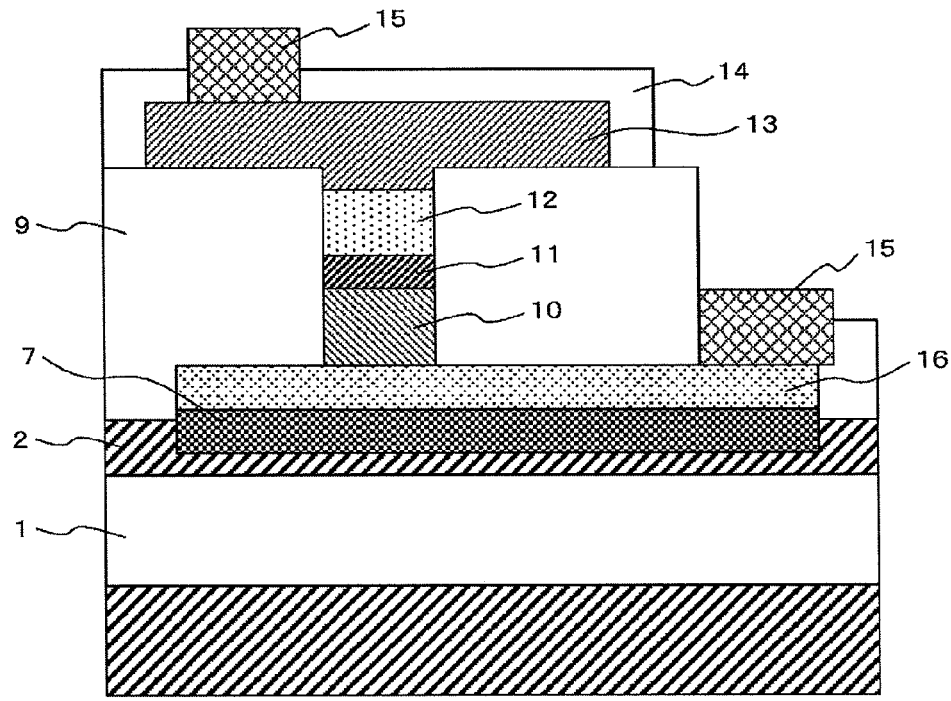
FIG. 2G is a schematic cross sectional view of the element in the manufacturing process steps of the silicon-germanium light emitting element according to Example 2.

Subsequently, a silicon dioxide insulating film 14 was deposited on the surface using a CVD device, for example. Subsequently, after applying a resist, a mask was exposed by photolithography to leave the resist only on a desired region, and then the silicon dioxide insulating film 14 was processed by wet etching to open the portions for a p-type electrode and an n-type electrode. Subsequently, after a TiN film and an Al film were in turn deposited entirely on the surface, a resist was applied, a mask was exposed by photolithography to leave the resist only on desired regions (regions on which the p-type electrode and the n-type electrode were formed), the exposed Al film was then wet-etched, the TiN film was etched, and then an electrode 15 formed of the stacked film of the TiN film and the Al film was formed. It is noted that dry etching may be used instead of wet etching with no inconvenience. Subsequently, a hydrogen annealing process was applied, and a device was completed by performing a process of hydrogen termination on defects produced in processing (FIG. 2G).

In the structure, electrons are injected from the metal electrode 15 to the n-type doped germanium buffer layer 16. In other words, since it is unnecessary to supply electrons to the silicon layer (the SOI layer) 2 below the n-type germanium buffer layer 16, the impurity concentration of the lower silicon layer 2 is low. That is, since the effect of carrier confinement into the n-type germanium light emitting layer 10 is higher than the n-type silicon layer 2, the structure contributes to highly efficient light emission.

As a result of evaluating the device, it was enabled to improve the luminous efficiency about a hundred times in a light emitting element. Moreover, in the case where the structure was applied to a light receiving element, it was enabled to improve the power consumption about ten times.

As described above, according to the example, the effect similar to the effect of Example 1 can be obtained. Moreover, the n-type germanium buffer layer 16 is provided on the condensation oxidation germanium layer 7, so that it is possible to provide a silicon-germanium semiconductor optical element that emits light more efficiently.

Example 3

A third example will be described with reference to FIGS. 3A to 3G. It is noted that the matters described in the first or second example but not described in the example are also applicable to the example except in special circumstances.

In this example, a highly reliable germanium laser diode of low power consumption in which a leakage current is reduced at a pn junction portion (a silicon-germanium semiconductor optical element) and a method for manufacturing the same are disclosed. FIGS. 3A to 3G are cross sectional structures in order of manufacturing process steps.

In the following, the manufacturing process steps will be described in order.

In order to prevent light leakage to the Si substrate side, an SOI substrate is prepared in which a buried oxide film 1 in a thickness of 1 μm or more is provided on a Si substrate. An SOI layer 2 has a thickness of about 200 to 300 nm capable of forming a single mode silicon wire waveguide.

Figure 3A:
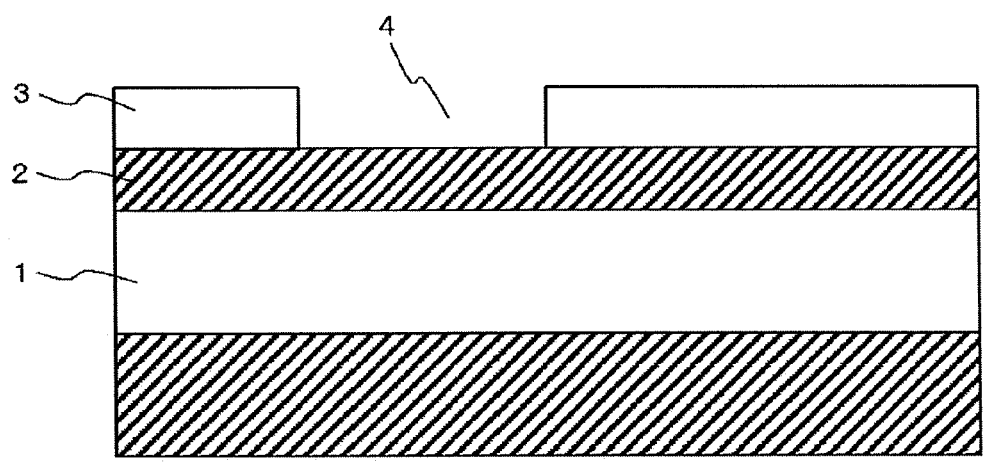
FIG. 3A is a schematic cross sectional view of an element in the manufacturing process steps of a silicon-germanium light emitting element according to Example 3.

After cleaning the SOI substrate, an insulating film 3 in a film thickness of 100 nm is formed by thermal oxidation. Alternatively, a silicon dioxide insulating film may be deposited on the surface using a CVD device, for example. Subsequently, a resist is applied, and a region on which germanium is formed is patterned by photolithography. Subsequently, the resist pattern is transferred to the thermal oxidation film to form an opening 4 by anisotropic dry etching or chemical etching using hydrofluoric acid, the surface of the SOI layer is partially exposed, and the resist is removed (FIG. 3A).

Figure 3B:
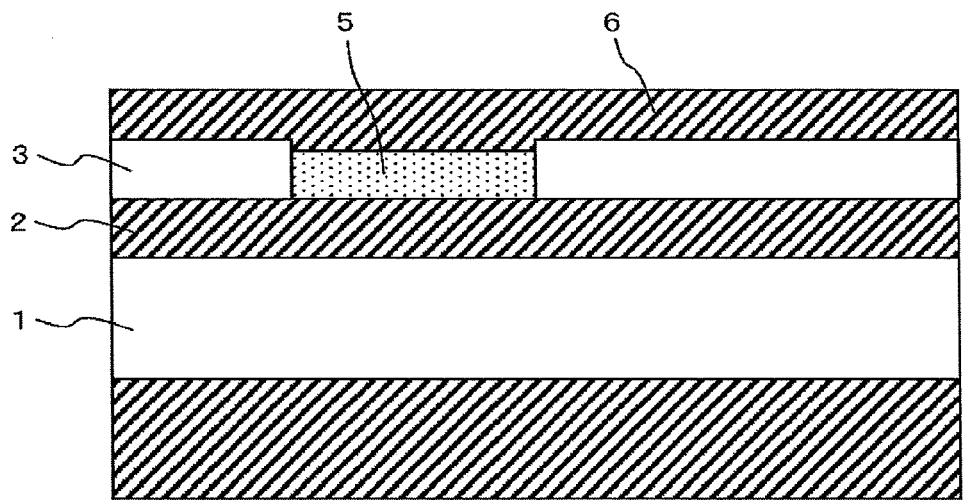
FIG. 3B is a schematic cross sectional view of the element in the manufacturing process steps of the silicon-germanium light emitting element according to Example 3.

Subsequently, the substrate is cleaned, a silicon-germanium mixed-crystal layer 5 (the germanium composition is 30%) in a film thickness of 30 nm is epitaxially grown on the cleaned SOI layer 2, and the surface is protected using a silicon cap layer 6 (FIG. 3B).

Figure 3C:
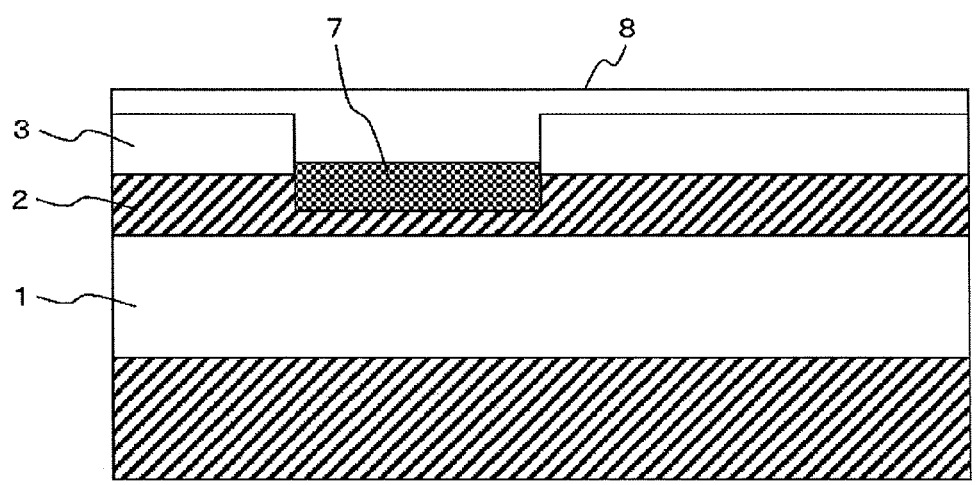
FIG. 3C is a schematic cross sectional view of the element in the manufacturing process steps of the silicon-germanium light emitting element according to Example 3.
Figure 3D:
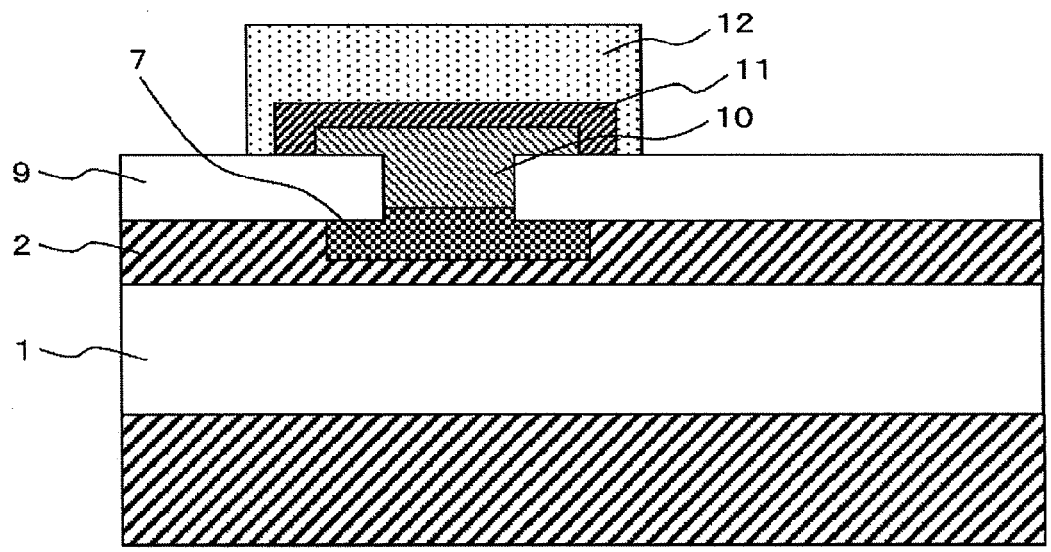
FIG. 3D is a schematic cross sectional view of the element in the manufacturing process steps of the silicon-germanium light emitting element according to Example 3.
Figure 3E:
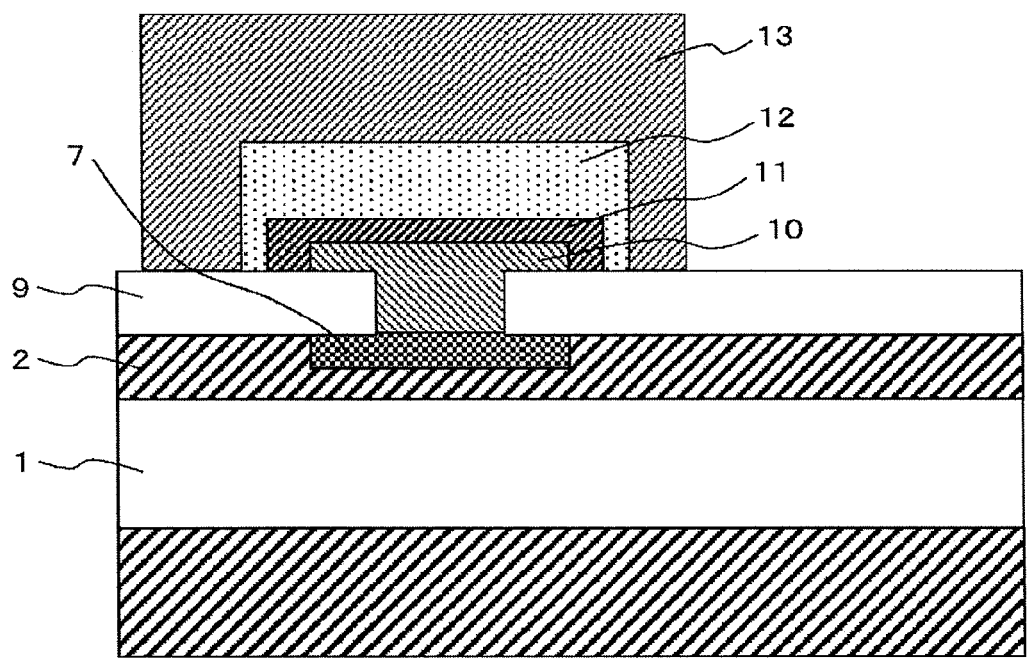
FIG. 3E is a schematic cross sectional view of the element in the manufacturing process steps of the silicon-germanium light emitting element according to Example 3.

After that, silicon in the surface silicon cap layer 6 and the silicon-germanium mixed-crystal layer 5 is oxidized by thermal oxidation processing, and a condensed germanium layer 7 is selectively formed on the SOI layer 2 (FIG. 3C). The condensation oxidation germanium layer 7 is formed in the state of particularly good crystallizability.

Subsequently, the insulating film 3 and the silicon dioxide film 8 are removed, a silicon dioxide insulating film 9 is deposited in a thickness of 100 nm by CVD, for example, and the surface of the condensation oxidation germanium layer is exposed by photolithography and chemical etching. Subsequently, an n-type doped germanium light emitting layer 10 (in a thickness of 300 nm) is epitaxially grown. The light emitting layer 10 is formed on the condensation oxidation germanium buffer layer 7 of high quality, so that an excellent light emitting layer 10 with few dislocations can be obtained.

In the film deposition process step, the particular effect can be obtained in which the germanium light emitting layer 10 is formed thicker than the silicon dioxide insulating film 9 in the opening and is formed wider than the opening by lateral growth. As illustrated in FIG. 3G, the plane (100) as well as planes (111) appear in germanium epitaxial growth on the plan orientation (100) of silicon. As a result, a slight gap remains on the boundary between the insulating film 9 and the germanium light emitting layer 10 in the opening. Therefore, when a p-type germanium layer (a protective layer) 11 is stacked above the n-type germanium light emitting layer 10, an electric current path is formed between the p-type germanium layer 11 and the germanium buffer layer 7. Since the path is a leakage component that does not contribute to light emission, the path is not desirable from the point of improving the element characteristics. Thus, the germanium light emitting layer 10 is formed wider than the opening as described above, so that it is possible to prevent the occurrence of the leakage current path.

Figure 3F:
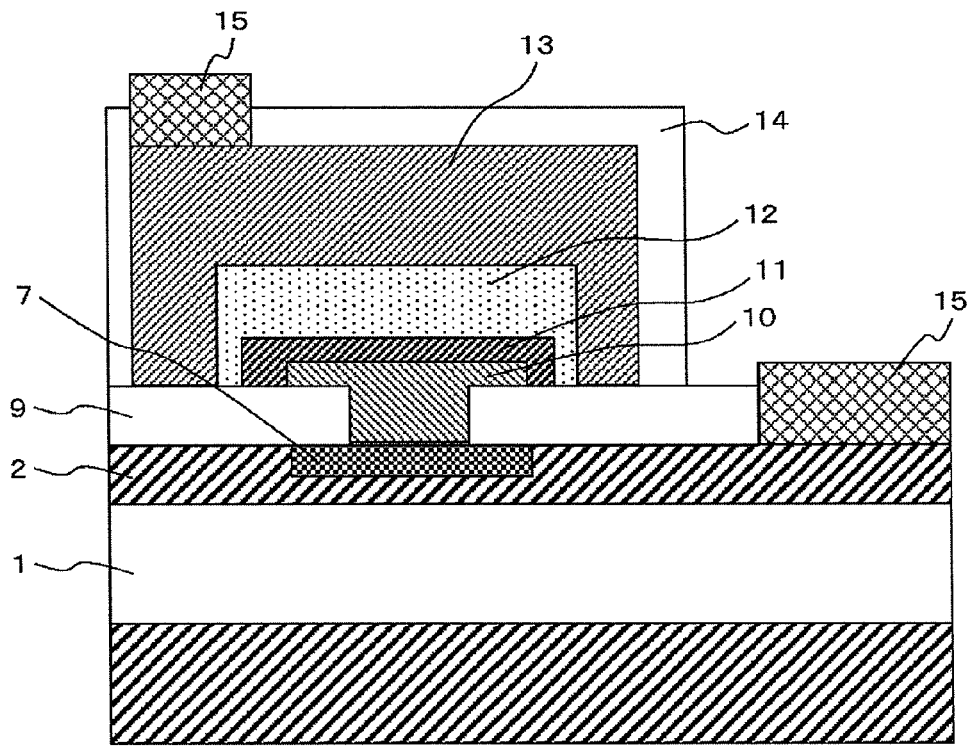
FIG. 3F is a schematic cross sectional view of the element in the manufacturing process steps of the silicon-germanium light emitting element according to Example 3.
Figure 3G:
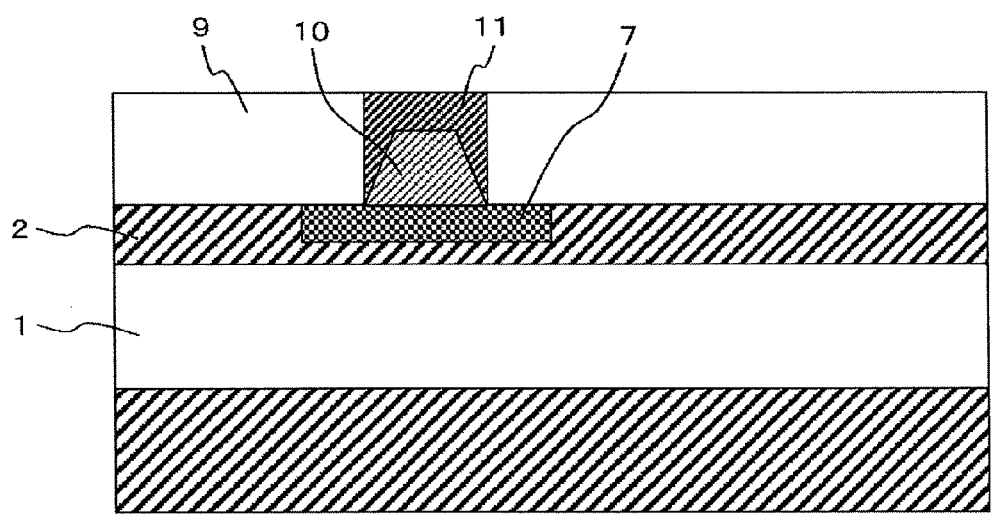
FIG. 3G is a schematic cross sectional view of the element in the manufacturing process steps of the silicon-germanium light emitting element according to Example 3.

After the germanium light emitting layer 10 is formed, subsequently, the p-type germanium layer 11 and a p-type silicon-germanium mixed-crystal layer (a cladding layer) 12 are formed by the process similar to the process in Example 1 (FIG. 3D), the p-type polysilicon layer 13 is formed (FIG. 3E), and an electrode 15 is formed to complete a device (FIG. 3F).

As a result of evaluating the device, it was enabled to improve the luminous efficiency about a hundred times in a light emitting element. Moreover, in the case where the device was applied to a light receiving element, it was enabled to improve the power consumption about ten times.

As described above, according to the example, the effect similar to the effect of Example 1 can be obtained. Moreover, such a shape is formed that the germanium light emitting layer or absorption layer covers and blocks the opening, so that it is possible to avoid the formation of an unintended pn junction in the region other than the light emitting layer or absorption layer in the pn diode in which the germanium layer is selectively grown, and it is possible to increase an electric current and improve a withstand voltage in the silicon-germanium semiconductor optical element.

Example 4

Figure 4A:
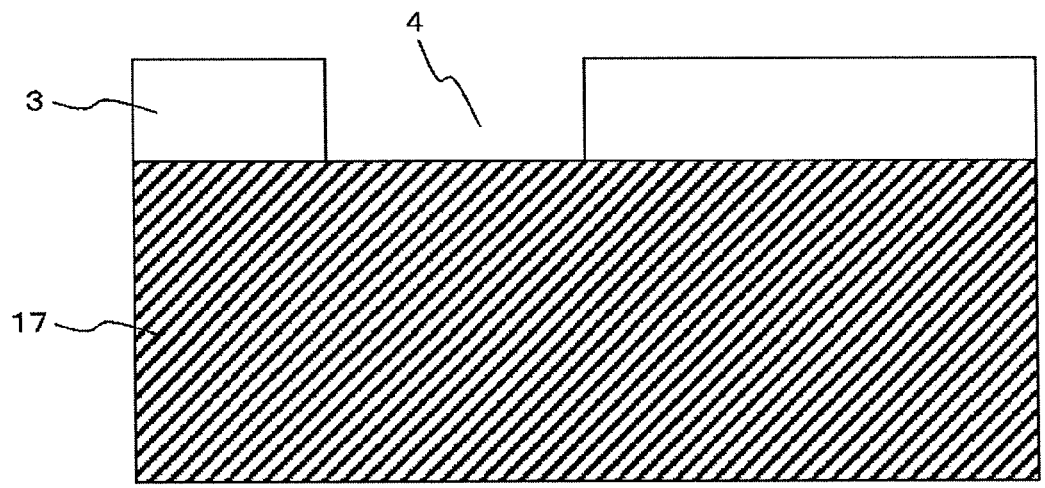
FIG. 4A is a schematic cross sectional view of an element in the manufacturing process steps of a silicon-germanium light emitting element according to Example 4.
Figure 4B:
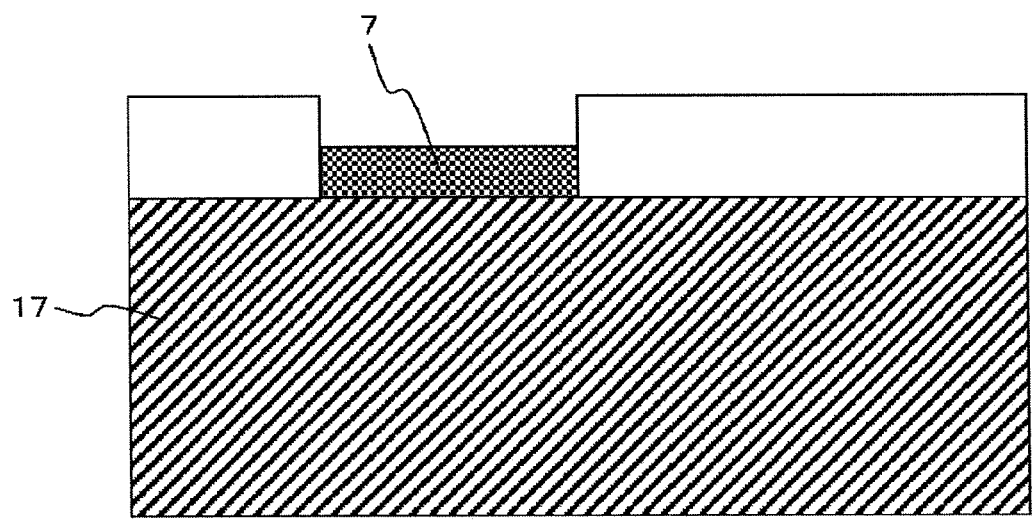
FIG. 4B is a schematic cross sectional view of the element in the manufacturing process steps of the silicon-germanium light emitting element according to Example 4.
Figure 4C:
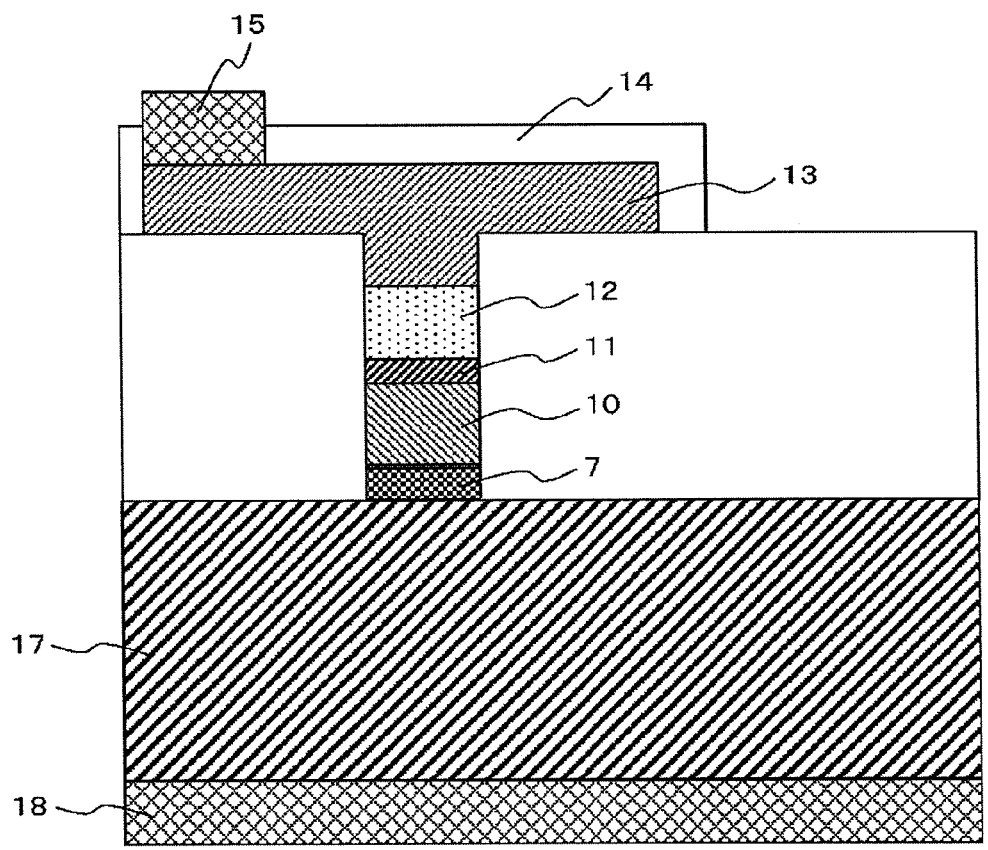
FIG. 4C is a schematic cross sectional view of the element in the manufacturing process steps of the silicon-germanium light emitting element according to Example 4.

A fourth example will be described with reference to FIGS. 4A to 4C. It is noted that the matters described in any one of Examples 1 to 3 but not described in this example are also applicable to this example except in special circumstances.

In this example, a germanium laser diode (a silicon-germanium semiconductor optical element) formed on a silicon substrate whose cost is lower than the cost of the SOI substrate and a method for manufacturing the same will be described. FIGS. 4A to 4C are cross sectional structures in order of manufacturing process steps.

In the following, the manufacturing process steps will be described in order.

After cleaning an n-type silicon substrate 17, an insulating film 3 in a film thickness of 100 nm is formed by thermal oxidation. Alternatively, a silicon dioxide insulating film may be deposited on the surface using a CVD device, for example. Subsequently, a resist is applied, and a region on which germanium is formed is patterned by photolithography. Subsequently, the resist pattern is transferred to the thermal oxidation film to form an opening 4 by anisotropic dry etching or chemical etching using hydrofluoric acid, the surface of the silicon layer is partially exposed, and the resist removed (FIG. 4A).

Subsequently, the substrate is cleaned, and an n-type doped germanium buffer layer 7 (in a thickness of 50 nm) is epitaxially grown on the surface of the cleaned silicon substrate 17 at a temperature of 500° C. (FIG. 4B). The buffer layer 7 formed at low temperature is a base, so that an excellent light emitting layer with few dislocations can be obtained.

After the process, the process steps to the process step of opening the portion of a p-type electrode are omitted because the process steps are similar to the process steps in Example 1. However, in this element, the portion of the p-type electrode is not opened. Subsequently, after a TiN film and an Al film were in turn deposited entirely on the surface, a resist was applied, a mask was exposed to leave the resist only in a desired region (a region on which the p-type electrode is formed) by photolithography, the exposed Al film was then wet-etched, the TiN film was etched, and then an electrode 15 formed of the stacked film of the TiN film and the Al film was formed. It is noted that dry etching may be used instead of wet etching with no inconvenience. Moreover, an electrode 18 formed of a stacked film of a TiN film and an Al film was formed also on the back surface of the n-type silicon substrate 17 to form an n-type electrode. Subsequently, a hydrogen annealing process was applied, and a device was completed by performing a process of hydrogen termination on defects produced in processing (FIG. 4C).

As a result of evaluating the device, it was enabled to improve the luminous efficiency about a hundred times in a light emitting element. Moreover, in the case where the device was applied to a light receiving element, it was enabled to improve the power consumption about ten times.

As described above, according to the example, the effect similar to the effect of Example 1 can be obtained at low costs.

Example 5

A fifth example will be described with reference to FIGS. 5A to 5E. It is noted that the matters described in any one of Examples 1 to 4 but not described in this example are also applicable to this example except in special circumstances.

In this example, a germanium field effect modulator, which is one of silicon-germanium semiconductor optical elements, and a method for manufacturing the same will be described. FIGS. 5A to 5E are cross sectional structures in order of manufacturing process steps.

In the following, the manufacturing process steps will be described in order.

Figure 5A:
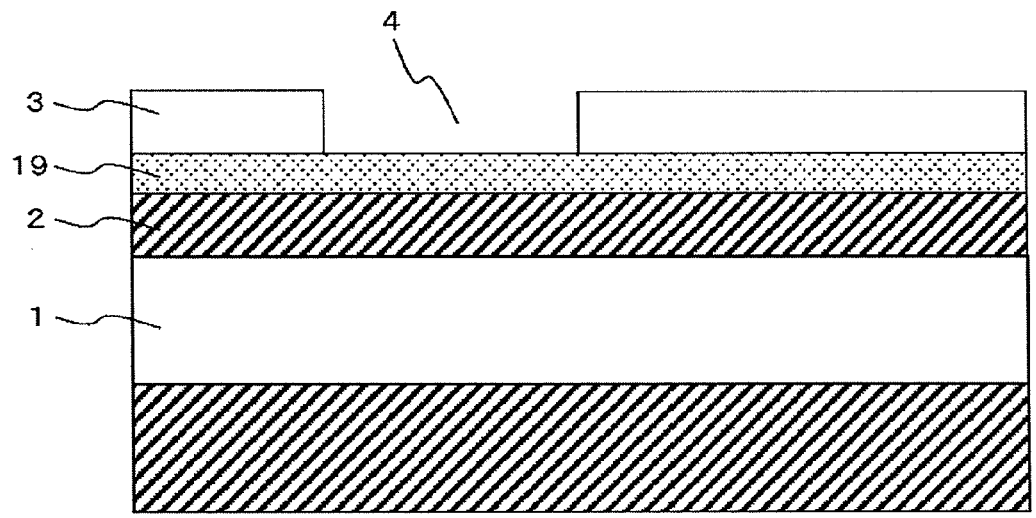
FIG. 5A is a schematic cross sectional view of an element in the manufacturing process steps of a germanium field effect modulator according to Example 5.

In order to prevent light leakage to the Si substrate side, an SOI substrate is prepared in which a buried oxide film 1 in a thickness of 1 µm or more is provided on a Si substrate. An SOI layer 2 has a thickness of about 200 to 300 nm capable of forming a single mode silicon wire waveguide. An n-type silicon layer 19 in a film thickness of 50 nm is epitaxially grown on the cleaned SOI layer 2. The silicon layer of high electrical conductivity is disposed below the germanium layer, so that an electric field can be effectively applied to the germanium layer. That is, a high extinction ratio can be obtained at a low voltage. Subsequently, an insulating film 3 in a film thickness of 100 nm is formed by thermal oxidation. Alternatively, a silicon dioxide insulating film may be deposited on the surface using a CVD device, for example. Subsequently, a resist is applied, and a region on which germanium is formed is patterned by photolithography. Subsequently, the resist pattern is transferred to the thermal oxidation film to form an opening 4 by anisotropic dry etching or chemical etching using hydrofluoric acid, the surface of the SOI layer is partially exposed, and the resist is removed (FIG. 5A).

Figure 5B:
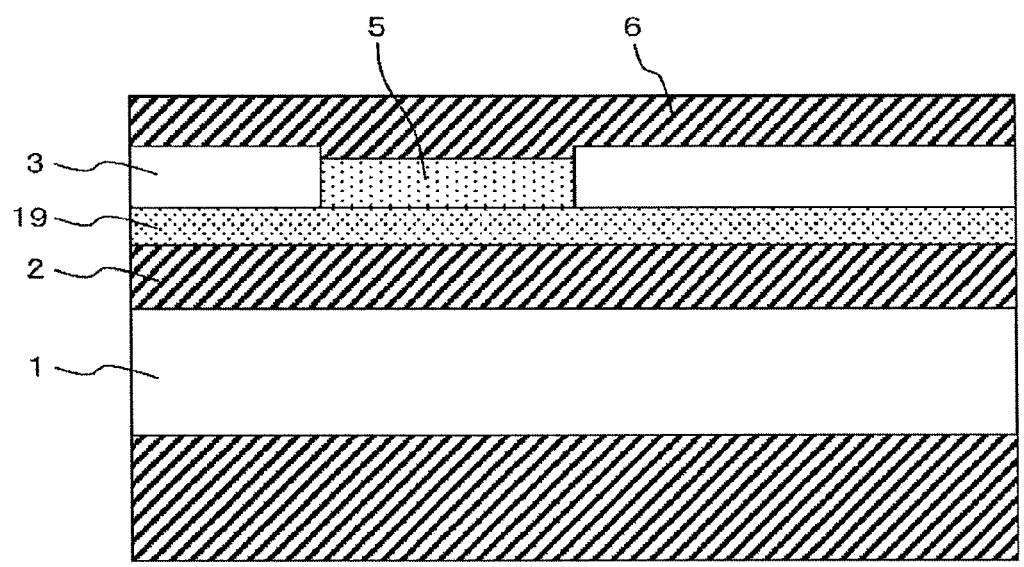
FIG. 5B is a schematic cross sectional view of the element in the manufacturing process steps of the germanium field effect modulator according to Example 5.

Subsequently, a silicon-germanium mixed-crystal layer 5 (the germanium composition is 30%) in a film thickness of 30 nm is epitaxially grown, and the surface is protected using a silicon cap layer 6 (FIG. 5B).

Figure 5C:
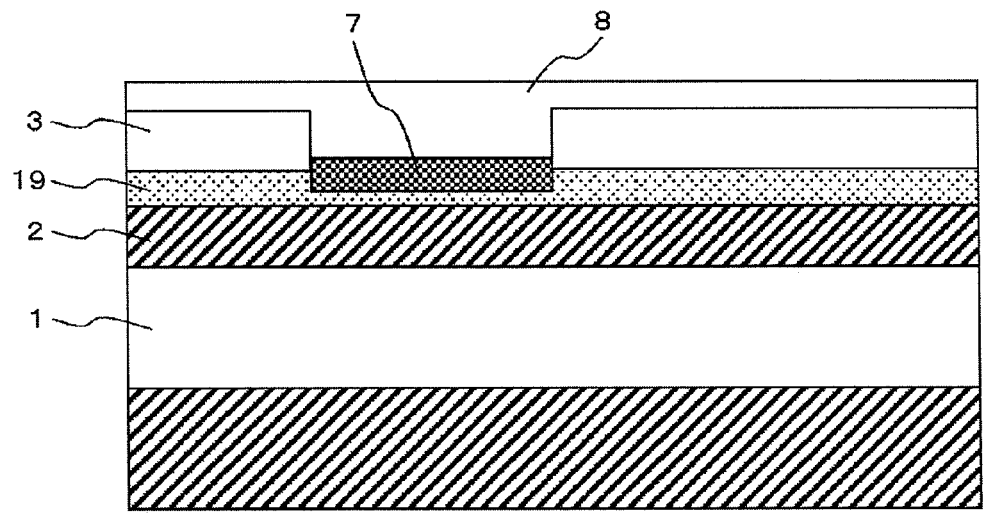
FIG. 5C is a schematic cross sectional view of the element in the manufacturing process steps of the germanium field effect modulator according to Example 5.

After that, silicon in the surface silicon cap layer 6 and the silicon-germanium mixed-crystal layer 5 is oxidized by thermal oxidation processing, and a condensed germanium layer 7 is selectively formed on the SOI layer 2. The germanium layer 7 is formed in the state of particularly good crystallizability (FIG. 5C).

Figure 5D:
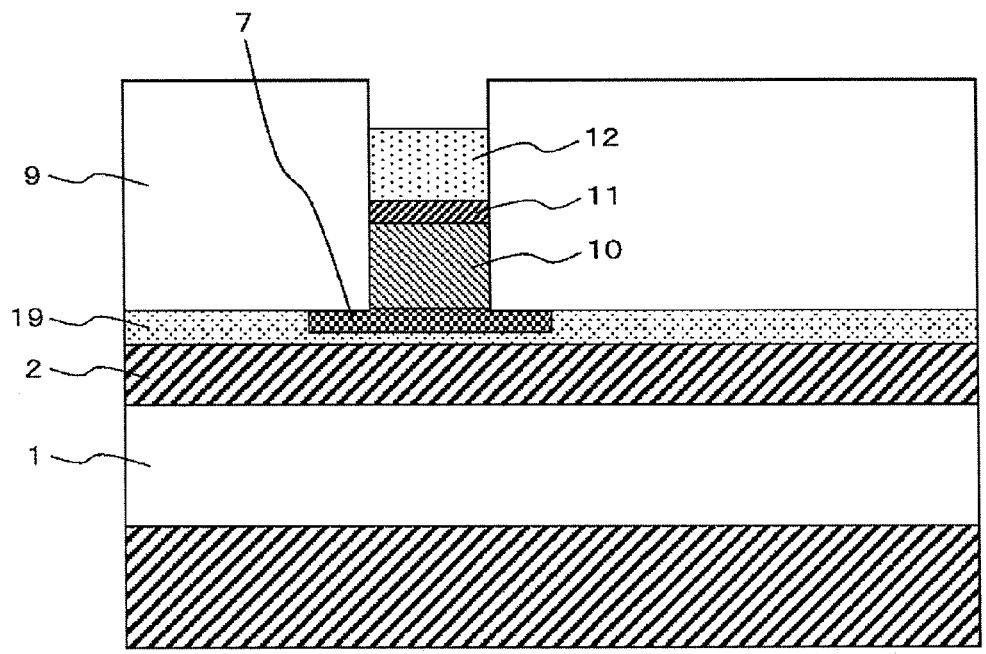
FIG. 5D is a schematic cross sectional view of the element in the manufacturing process steps of the germanium field effect modulator according to Example 5.

After the silicon dioxide film 8 formed in the condensation oxidation process step is removed using hydrofluoric acid, a silicon dioxide insulating film 9 is deposited in a thickness of 500 nm by CVD, for example, and the surface of the condensation oxidation germanium layer is exposed by photolithography and chemical etching. Subsequently, an n-type doped absorption layer 10 (in a thickness of 200 nm) is epitaxially grown. Since the absorption layer 10 is formed on the condensation oxidation germanium layer of high quality, an excellent absorption layer 10 with few dislocations can be obtained. Subsequently, in order to form an excellent pn junction without causing defects on the upper part of the absorption layer, a p-type germanium layer (a protective layer) 11 is formed to protect the surface of the n-type germanium absorption layer 10. The p-type germanium layer 11 has a low defect density because the p-type germanium layer 11 is in lattice matching with the absorption layer 10, so that carrier leakage on the interface is suppressed. Moreover, a p-type silicon-germanium mixed-crystal layer (a cladding layer) 12 (the germanium composition is 80%) is formed as a cladding layer in which the wavelength is about 1.6 μm and the refractive index is lower than the refractive index of the absorption layer 10 (FIG. 5D).

Figure 5E:
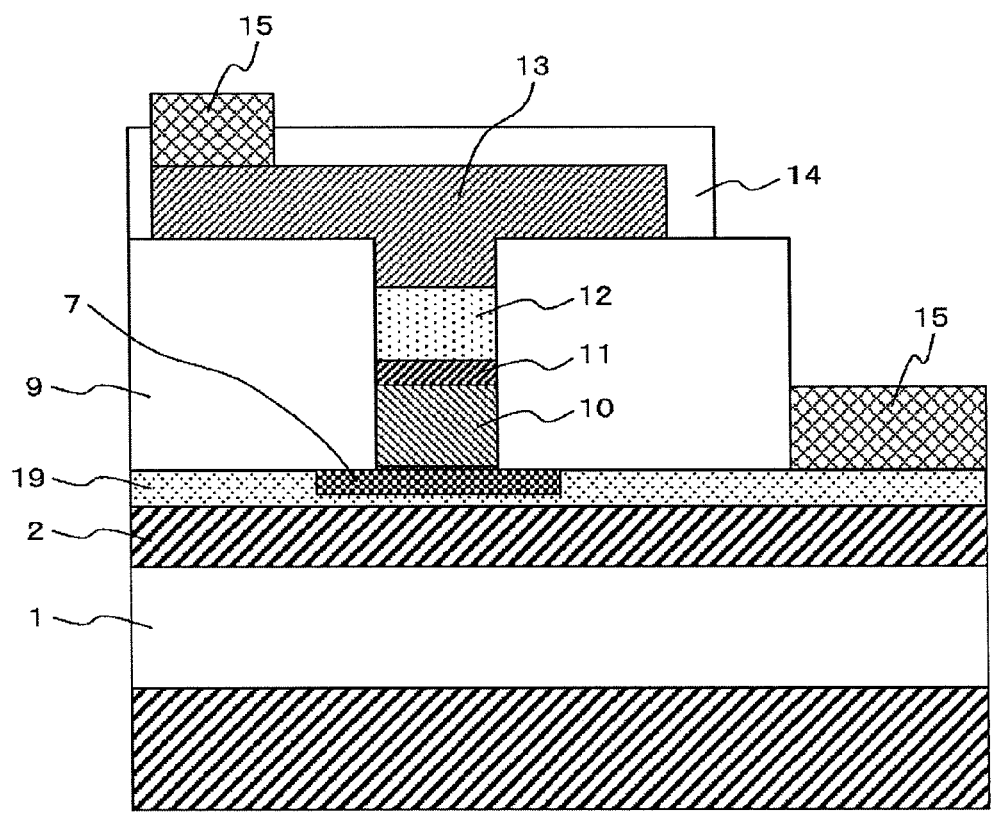
FIG. 5E is a schematic cross sectional view of the element in the manufacturing process steps of the germanium field effect modulator according to Example 5.

Subsequently, a p-type polysilicon layer 13 doped with an impurity at a high concentration of about $1 \times 10^{20}/cm^3$ is deposited. Moreover, the germanium field effect modulator according to the example has a pn junction on the interface of a low defect density, so that a reliable germanium field effect modulator of a high withstand voltage can be prepared. Subsequently, a silicon dioxide insulating film 14 was deposited on the surface of the substrate on which the p-type polysilicon layer 13 was formed using a CVD device, for example. Subsequently, after applying a resist, a mask was exposed by photolithography to leave the resist only on a desired region, and then the silicon dioxide insulating film 14 was processed by wet etching to open the portions for a p-type electrode and an n-type electrode. In the processing, since the selection ratio of etching is sufficiently great between silicon dioxide and the electrodes, the openings can be formed with no problems even though a step is provided between the n-type electrode and the p-type electrode. Subsequently, after a TiN film and an Al film were in turn deposited entirely on the surface, a resist was applied, a mask was exposed by photolithography to leave the resist only on a desired region (a region on which the n-type electrode and the p-type electrode are formed), the exposed Al film was then wet-etched, the TiN film was etched, and an electrode 15 formed of a stacked film of the TiN film and the Al film was patterned. It is noted that dry etching may be used for the patterning method with no inconvenience. Subsequently, a hydrogen annealing process was applied, and a device was completed by performing a process of hydrogen termination on defects produced in processing (FIG. 5E).

As a result of evaluating the device, it was enabled to improve the power consumption about ten times in a light receiving element. Moreover, in the case where the device was applied to a light emitting element, it was enabled to improve the luminous efficiency about a hundred times.

As described above, according to the example, the effect similar to the effect of Example 1 can be obtained. Moreover, the n-type silicon layer 19 is provided on the SOI layer 2, so that it is possible to obtain a high extinction ratio at a low voltage.

It is noted that the present invention is not limited to the foregoing examples, and includes various exemplary modifications. For example, the forging examples are described in detail for easily understanding the present invention. The present invention is not always limited to ones including all the described configurations. Moreover, a part of the configuration of an example can be replaced by the configuration of another example, and the configuration of another example can be added to the configuration of an example. Furthermore, a part of the configurations of the examples can be added with, deleted from, or replaced by the other configurations.

REFERENCE SIGNS LIST

1 Buried oxide film
2 SOI (Silicon on Insulator) layer
3 Insulating film
4 Insulating film opening
5 Silicon-germanium mixed-crystal layer
6 Silicon cap layer
7 Germanium buffer layer
8 Silicon dioxide film
9 Insulating film
10 N-type germanium light emitting layer or absorption layer
11 P-type germanium layer (protective layer)
12 P-type silicon-germanium mixed-crystal layer (cladding layer)
13 Polysilicon layer
14 Insulating film
15 Electrode formed of a stacked film of the TiN film and the Al film
16 Germanium buffer layer
17 Silicon substrate
18 Electrode formed of a stacked film of the TiN film and the Al film
19 N-type silicon layer

The invention claimed is:

1. A semiconductor optical element comprising:
   a semiconductor substrate;
   a germanium light emitting layer or a germanium light absorption layer formed on the substrate; and
   an insulating film formed on the substrate,
   wherein the semiconductor optical element includes a structure in which:
   a germanium protective layer whose electrical conductivity is different from electrical conductivity of the light emitting layer or the light absorption layer is disposed above the light emitting layer or the light absorption layer;
   a cladding layer whose electrical conductivity is the same as electrical conductivity of the protective layer is formed above the germanium protective layer; and
   an insulating layer is disposed on both side surfaces of the light emitting layer or the light absorption layer.

2. The semiconductor optical element according to claim 1, wherein the cladding layer includes the same constituent element as a constituent element of the germanium protective layer.

3. The semiconductor optical element according to claim 1, wherein the cladding layer includes $Si_{1-x}Ge_x$ $(0 \le x \le 1)$.

4. The semiconductor optical element according to claim 1, wherein the cladding layer includes a structure in which germanium composition $Si_{1-x}Ge_x$ $(0 \le x \le 1)$ is changed step by step or continuously in the layer.

5. The semiconductor optical element according to claim 1, wherein the protective layer includes a structure in which germanium composition $Si_{1-x}Ge_x$ $(0 \le x \le 1)$ is changed step by step or continuously in the layer and Ge is rich at the germanium light emitting layer side.

6. The semiconductor optical element according to claim 1, wherein a conductive type of the germanium light emitting layer or the light absorption layer is n-type; and
   a conductive type of the protective layer is p-type.

7. The semiconductor optical element according to claim 1, wherein the light emitting layer includes germanium.

8. The semiconductor optical element according to claim 1, wherein a $Si_{1-x}Ge_x$ $(0 \le x \le 1)$ layer whose electrical conductivity is the same as electrical conductivity of the germanium light emitting layer or the light absorption layer is provided below the germanium light emitting layer or the light absorption layer.

9. The semiconductor optical element according to claim 1, wherein the germanium light emitting layer or the light absorption layer, and the protective layer, the cladding layer, and the polysilicon layer are formed on a silicon substrate.

10. The semiconductor optical element according to claim 1, wherein the germanium light emitting layer or the light absorption layer is formed thicker than the insulating layers on both sides.

11. The semiconductor optical element according to claim 10, wherein the germanium light emitting layer or the light absorption layer is formed wider than a width of an opening portion of the insulating film, above an end of the opening portion.

12. The semiconductor optical element according to claim 1, wherein a polysilicon layer whose conductive type is the same as a conductive type of the cladding layer is formed on the cladding layer.

13. The semiconductor optical element according to claim 12, wherein the germanium light emitting layer or the light absorption layer, and the protective layer, the cladding layer, and the polysilicon layer are formed on an SOI substrate.

14. The semiconductor optical element according to claim 12, wherein the germanium light emitting layer or the light absorption layer, and the protective layer, the cladding layer, and the polysilicon layer are formed on a GeOI substrate.

15. A semiconductor optical element comprising:
a substrate including silicon;
a n-type germanium buffer layer formed above the substrate;
a n-type germanium light emitting layer or an n-type germanium light absorption layer formed on the n-type germanium buffer layer;
a p-type germanium protective layer of non-light emission formed on the light emitting layer or the light absorption layer; and
a cladding layer including a p-type silicon-germanium mixed-crystal layer and formed on the p-type germanium protective layer.

16. The semiconductor optical element according to claim 15, wherein the germanium light emitting layer or the light absorption layer has dimensions larger at a top end than at a lower end portion.

* * * * *